(12) United States Patent
Mallecot et al.

(10) Patent No.: US 6,236,794 B1
(45) Date of Patent: May 22, 2001

(54) MULTI-SECTION ELECTRO-OPTICAL MONOLITHIC COMPONENT

(75) Inventors: Franck Mallecot, Montrouge; Antonina Plais, Paris; Christine Chaumont, Villejuif, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/327,533

(22) Filed: Jun. 8, 1999

(30) Foreign Application Priority Data

Jun. 15, 1998 (FR) .................................................. 98 07492

(51) Int. Cl.[7] ...................................................... G02B 6/10
(52) U.S. Cl. .......................... 385/132; 385/129; 385/130; 385/131; 385/132; 385/14; 257/86; 257/87; 372/46; 372/44; 372/92
(58) Field of Search .................................. 257/86, 79, 96, 257/87; 385/132, 129, 131, 14; 372/46, 44, 92

(56) References Cited

FOREIGN PATENT DOCUMENTS

| 0 314 490 A2 | 5/1989 | (EP) . |
| 0 729 042 A1 | 8/1996 | (EP) . |
| 62-291987 | 12/1997 | (JP) . |

OTHER PUBLICATIONS

Ramdane A. Et al.: "Very Simple Approach for High Performance DFB Laser–Electroabsorption Modulator Monolithic Integration" Electronic Letters, vol. 30, No. 23, Nov. 10, 1994, p. 1980–1981 XP000495748.

Lammert R. M. et al.: "InGaAS–GaAs Quantum–Well Lasers with Monolithically Integrated Intracavity Electroabsorption Modulators by Selective–Area MOCVD" IEEE Photonics Technology Letters, vol. 8, No. 1, Jan. 1, 1996, pp. 78–80, XP000547540.

*Primary Examiner*—Frank G. Font
*Assistant Examiner*—Michael P. Mooney
(74) *Attorney, Agent, or Firm*—Sughrue, Mion, Zinn, Macpeak & Seas, PLLC

(57) ABSTRACT

The invention relates to a semiconductor electro-optical monolithic component. The component is made up of at least two sections, each of which has a respective waveguide, the waveguides being etched in the form of ridges, disposed in line, and buried in a cladding layer. The sections are electrically isolated from one other by a resistive zone. At the interface between two sections, the waveguides are locally of an extended width not less than the width of the resistive zone.

6 Claims, 5 Drawing Sheets

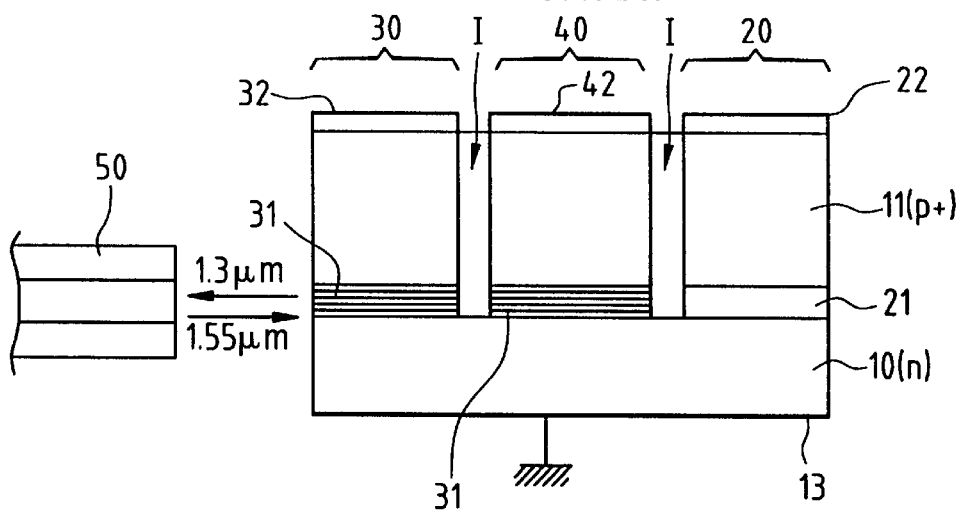
FIG_1
PRIOR ART
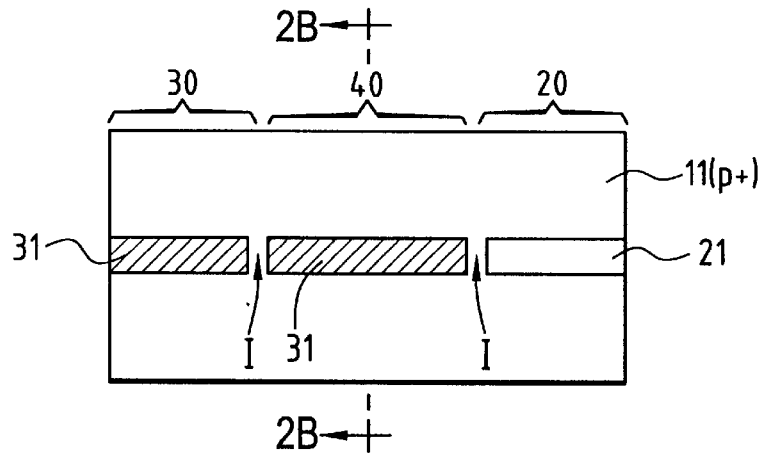
FIG_2A
PRIOR ART
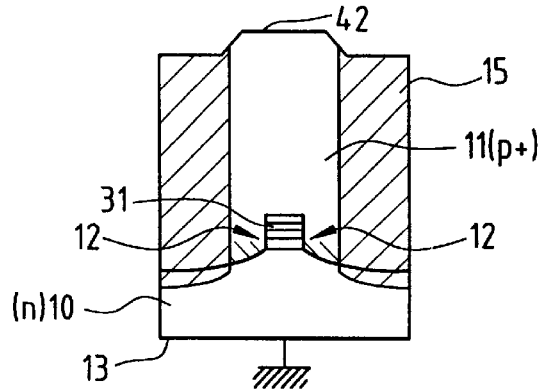
FIG_2B
PRIOR ART

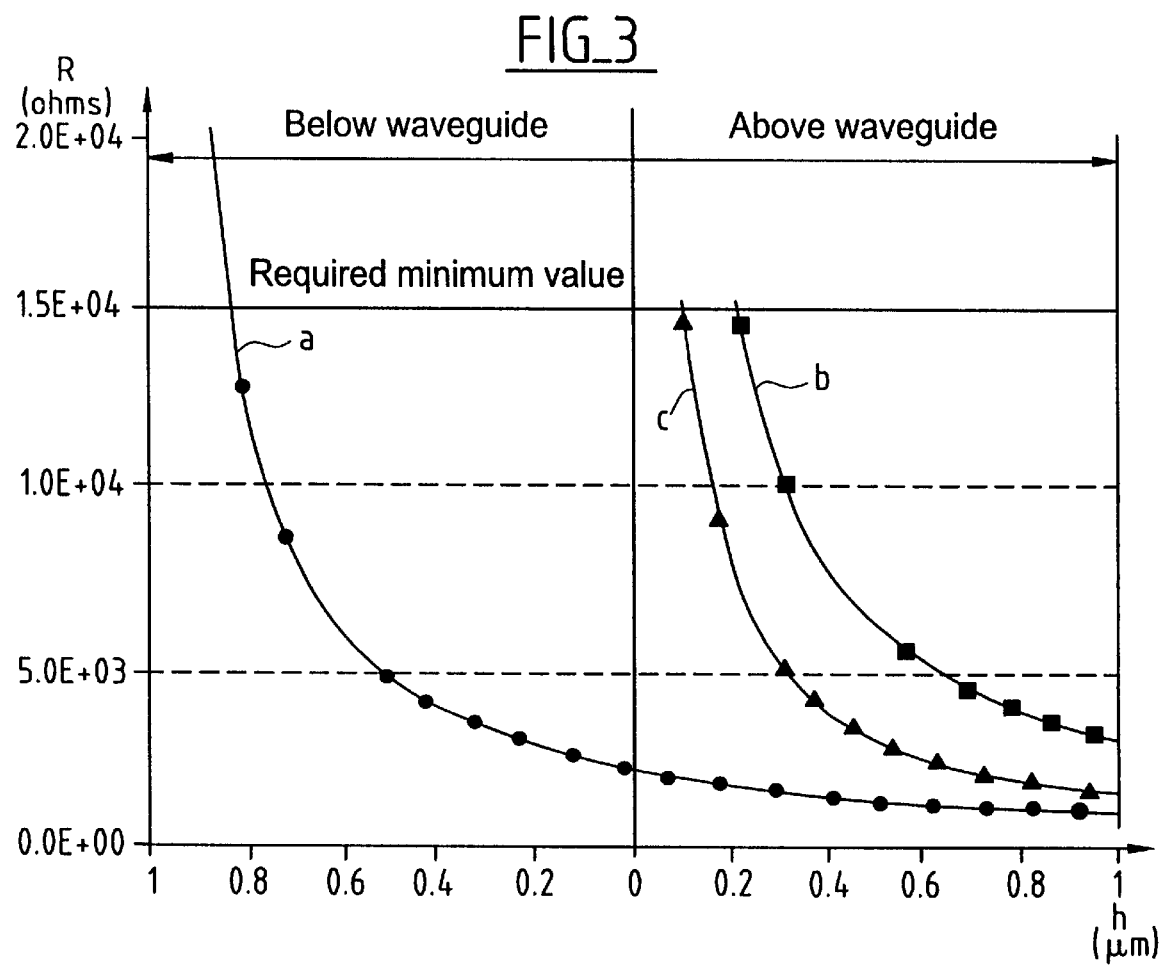
FIG_3
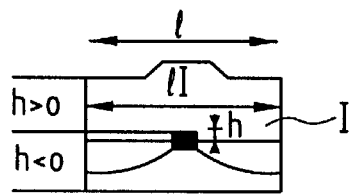
FIG_3a
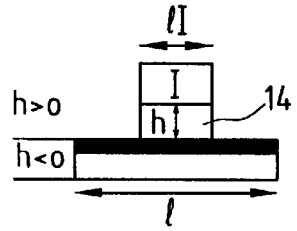
FIG_3b
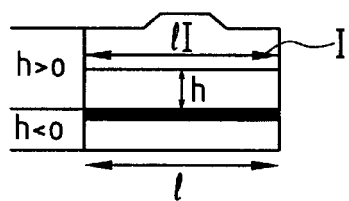
FIG_3c

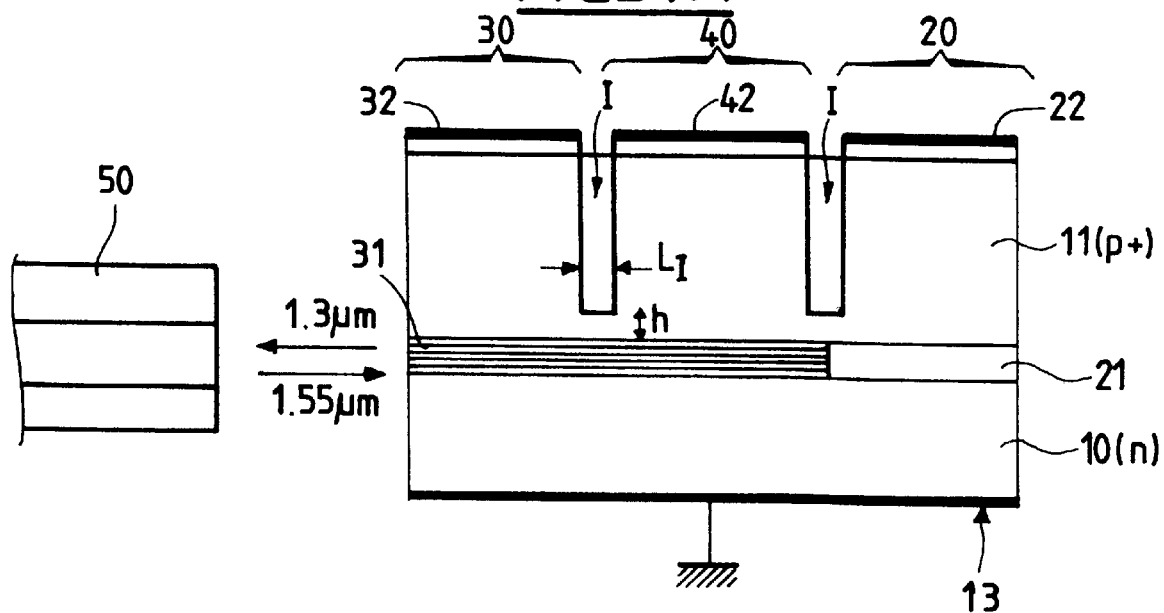
FIG_4A
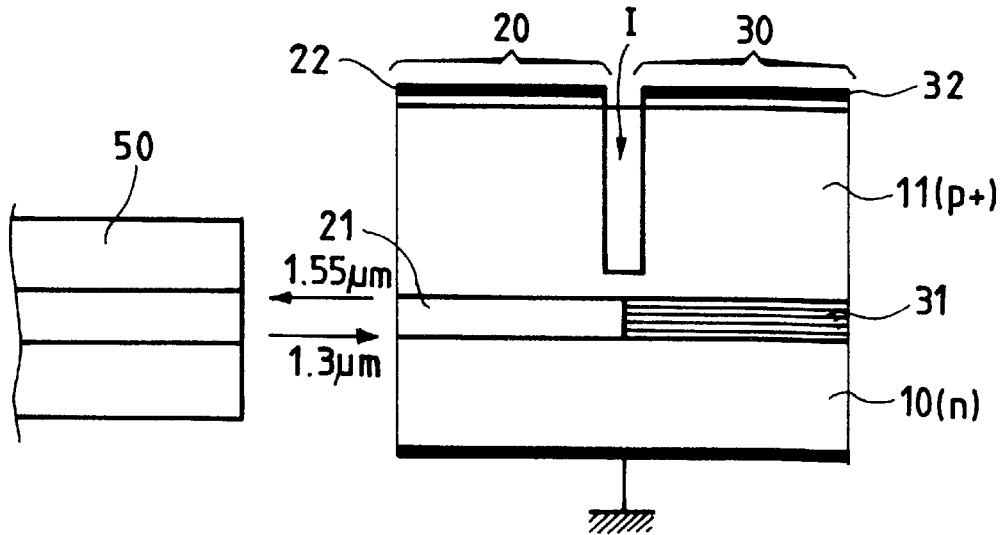
FIG_4B

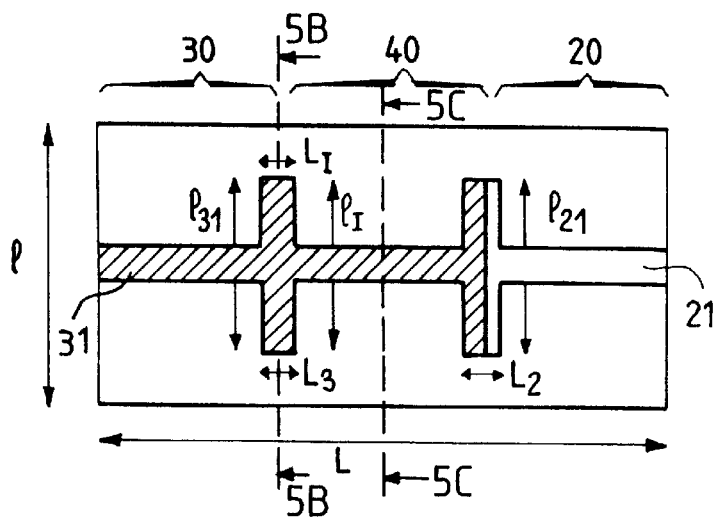
FIG_5A
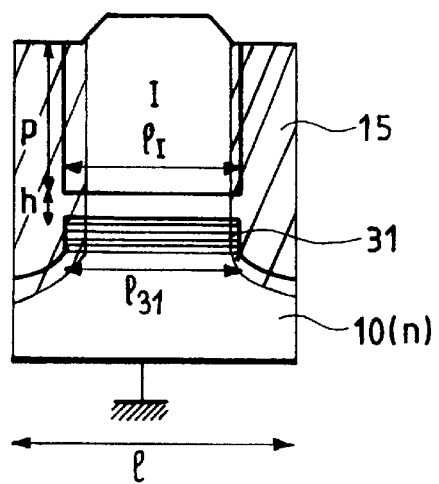
FIG_5B
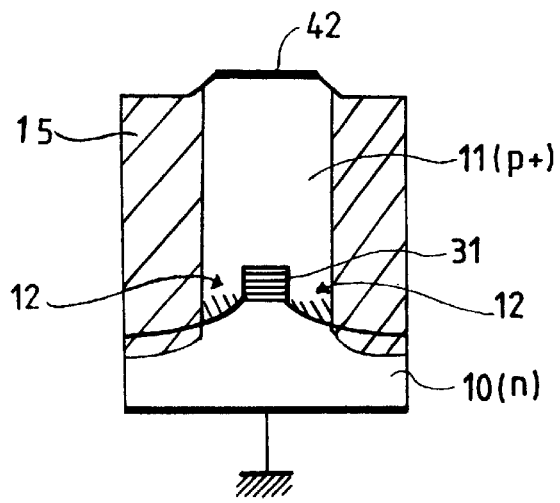
FIG_5C

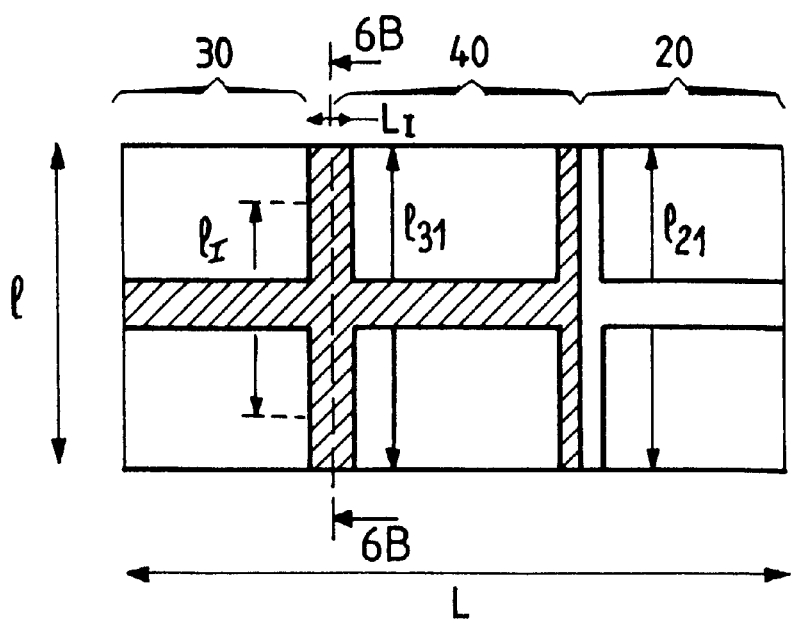
FIG_6A
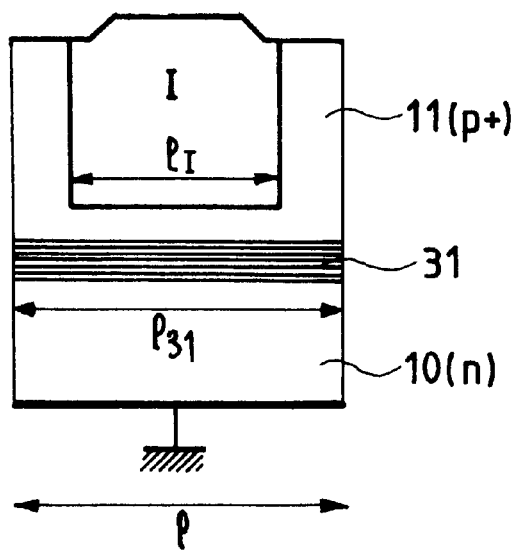
FIG_6B

MULTI-SECTION ELECTRO-OPTICAL MONOLITHIC COMPONENT

The present invention relates to a semiconductor electro-optical monolithic component made up of at least two sections disposed in line, each of which has a waveguide etched in the form of a ridge and buried in a cladding layer.

BACKGROUND OF THE INVENTION

For this type of buried-ridge multi-section electro-optical component, it is important to provide a high degree of electrical isolation between each section. Typically, it is necessary to provide resistance of not less than 15 kΩ at the interface between two sections, so as to prevent the sections from interacting with each other while the component is operating.

By way of example, FIG. 1 is a diagram in longitudinal section through an in-line transmitter-receiver device (1D-TRD) obtained by monolithically integrating a laser 30 and a detector 20 on the same substrate 10. The laser 30 transmits a signal, e.g. at a wavelength of 1.3 μm to an optical fiber 50, and the detector receives a signal from the same optical fiber 50, e.g. at a wavelength of 1.55 μm. In this example, since the transmit wavelength is shorter than the receive wavelength, the component includes a third section, disposed between the laser 30 and the detector 20, and forming an optical isolator 40. The purpose of the optical isolator 40 is to absorb the light emitted, at 1.3 μm, via the rear face of the laser, and thereby to prevent the detector from being dazzled, so that said detector can detect the optical signal at 1.55 μm coming from the optical fiber. The substrate 10 may, for example, be made of n-doped InP. The waveguides (21, 31) respectively of the detector 20, of the laser 30, and of the optical isolator 40 are etched in the form of ridges and buried in a layer of highly-doped optical cladding 11. The waveguides may be said to be of the "Buried Ridge Structure (BRS)" type. For example, the cladding material is p+ doped when the substrate is n-doped. Since said material is highly doped, it is made conductive.

FIG. 2A is a plan view of the component shown in FIG. 1, and FIG. 2B is a view in cross-section on A—A. In FIG. 2B, conductive channels situated on either side of the waveguide 31 are referenced 12. The presence of the conductive channels is due to the fact that the cladding layer 11 is highly doped. Proton implantation or lateral etching, referenced 15 in the diagram of FIG. 2B, and making the material resistive, also enables the width of the conductive channels 12 to be limited to a value typically lying in the range 10 μm to 12 μm, and enables the component to be isolated laterally. However, the conductive channels 12 prevent very high resistance from being obtained at the interface between two sections.

The compositions and dimensions chosen for the waveguides are of little importance. In the example shown in FIG. 1, the waveguide 21 of the detector is, for example, made of a ternary material, while the waveguide 31 of the laser and of the optical isolator 40 is in the form of a quantum-well structure.

Furthermore, metal electrodes 22, 32, 42, 13 are formed on the various sections and on the bottom face of the component so as to enable it to operate.

Because of the presence of the conductive channels 12 on either side of the waveguide ridges, it is necessary to form electrical isolation zones or "resistive zones" I, between the various sections 20, 30, 40 in order to prevent any section from interfering with another while the component is operating.

In order to form the resistive zones I, and in order to obtain very high interface resistance between two consecutive sections, three solutions have been studied so far.

The first solution consists in growing, by epitaxy, a semi-insulating indium phosphide material (InP:Fe) at the interfaces between the sections. Unfortunately, that solution cannot yet be adapted to satisfy the constraints of industrial production. In addition, it requires an additional growth step, which is unacceptable if a low-cost component is to be obtained.

The second solution consists in etching the cladding material 11 in the zones I situated at the interfaces between the sections.

The third solution consists in implanting protons in the cladding material 11 locally in the zones I situated at the interfaces between the sections. In which case, the protons generate crystal defects which enable the population type to be reversed. Thus, the cladding material 11 is made locally semi-insulating, and therefore highly resistive.

Unfortunately, the second and third solutions suffer from a major drawback. In order to obtain sufficient electrical isolation, i.e. in order to obtain interface resistance of not less than 15 kΩ, it is necessary to perform the etching or the proton implantation to a great depth, and in particular through the waveguides (see FIG. 1). Etching a waveguide or implanting protons in the core of a waveguide gives rise to crystal defects in the material. Such crystal defects generate light-diffusing centers, thereby giving rise to optical losses at the interfaces between the sections. Operation of the component is degraded by the optical losses. In addition, the higher the number of interfaces, the higher such optical losses become. The light signal, at 1.55 μm, which is output by the optical fiber 50 and injected into the detector 20 has to pass through two interfaces consecutively. The optical losses are therefore very high.

By way of example, for a received signal, at a wavelength of 1.55 μm, the optical losses, due to proton implantation at a density of $2 \times 10^{14}$ cm$^{-2}$, are about 0.8 dB for an implanted distance of length 5 μm, which corresponds to losses of about 3 dB for a component having two implanted sections of length 10 μm.

In addition, curve a shown in FIG. 3 represents the value of the interface resistance R as a function of the distance h between the bottom of the implantation zone (or of the etching zone) I and the top surface of the waveguide, for a component shown in cross-section in FIG. 3a and similar to the buried active ridge component shown in FIG. 1. The curve shows that, in order to achieve resistance of not less than 15 kΩ, it is necessary to implant protons through the waveguide (or to etch through the waveguide), so that the bottom of the resistive zone I is situated at a distance h approximately in the range 0.8 μm to 0.9 μm below the top surfaces of the waveguides.

Curve b in FIG. 3 shows the value of the interface resistance R as a function of the distance h between the bottom of the implantation zone (or of the etching zone) and the top surface of the waveguide for a prior art component in which the waveguide is of the ridge type, i.e. it is not etched. That component is shown in cross-section in FIG. 3b, and it includes a top layer 14 which is deposited on the waveguide and which is etched over a width and a length that are determined to create a refractive index contrast, and to make it possible to guide light. In that component, the waveguides are not buried. Satisfactory resistance values R are obtained for implantation (or etching) depths in the top layer 14 that are sufficiently shallow, i.e. for depths such that the bottom of the resistive zone I is situated at a distance h lying in the range 0.2 µm to 0.1 µm above the top surface of the waveguide. Therefore, in that case, the waveguide is not degraded by the implantation (or the etching).

OBJECTS AND SUMMARY OF THE INVENTION

An object of the present invention is to provide a multi-section electro-optical monolithic component having a buried active ridge (BRS type waveguide) and in which highly resistive electrical isolation zones I are formed at the interfaces between the sections over a depth that is shallow enough not to reach the waveguide. The component should also offer interface resistance values R of the same order of magnitude as those obtained with the ridge-type component.

More precisely, the invention provides a semiconductor electro-optical monolithic component made up of at least two sections, each of which has a respective waveguide, said waveguides being etched in the form of ridges, disposed in line, and buried in a cladding layer, and said sections being electrically isolated from one other by a resistive zone, wherein, at the interface between two sections, the waveguides are locally of an extended width not less than the width of the resistive zone.

The waveguide ridges of the various sections of the component thus have locally extended zones making it possible to eliminate locally the conductive channels situated on either side of the waveguides, and therefore to increase the interface resistance.

According to another characteristic of the invention, the resistive zone has a width not less than the conductive width of the cladding layer. The conductive width of the cladding layer is defined as being the sum of the widths of the conductive channels and of the waveguide buried in the cladding. Such a resistive zone width enables the conductive channels to be eliminated locally, and contributes to obtaining sufficient electrical isolation between two sections, i.e. resistance of not less than 15 kΩ.

According to another characteristic of the invention, the resistive zone is obtained by locally implanting protons in the cladding layer, and it has a bottom situated at a distance not less than 0.08 µm above the top surfaces of the waveguides.

According to another characteristic, the resistive zone is obtained by locally etching the cladding layer, and it has a bottom situated at a distance not less than 0.08 µm above the top surfaces of the waveguides.

By means of this multi-section component structure, the resistance values obtained at the interfaces between the sections are very high. Typically, they may be not less than 15 kΩ. These values are obtained without the electrical isolation zone reaching the waveguide, so that optical losses at the interfaces between the sections are reduced considerably, and operation of the electro-optical component is not disturbed.

BRIEF DESCRIPTION OF THE DRAWINGS

Other features and advantages of the invention appear on reading the following description given by way of non-limiting example and with reference to the accompanying figures, in which:

FIG. 1 (described above) is a diagram in longitudinal section through a prior art in-line transmitter-receiver;

FIGS. 2A and 2B (described above) are respectively a plan view and a cross-section view of the component shown in FIG. 1;

FIG. 3 shows curves a, b, and c indicating the value of the interface resistance R as a function of the distance h between the bottom of the resistive zone (I) and the top surfaces of the waveguides, the curves being associated respectively with respective ones of two prior art components shown in FIGS. 3a and 3b, and with a component of the invention shown in FIG. 3c;

FIGS. 4A and 4B are respective longitudinal section views of two types of in-line transmitter-receiver components of the invention;

FIGS. 5A, 5B, and 5C are respectively a plan view of the component shown in FIG. 4, a view in cross-section through the electrical isolation zone of the FIG. 4 component, and a view in cross-section through one of the sections of the FIG. 4 component; and FIGS. 6A and 6B are respectively a plan view and a cross-section view of a variant embodiment of the component shown in FIG. 4A.

MORE DETAILED DESCRIPTION

FIGS. 4A and 4B show two types of in-line transmitter-receiver component of the invention, seen in longitudinal section. The component shown in FIG. 4A corresponds to the component shown in FIG. 1, and like references are used to designate like elements. The only visible difference compared with the prior art component as shown in FIG. 1 lies in the fact that the electrical isolation zones I are implemented over a depth that is shallow enough not to reach the waveguides 21 and 31 and to leave them intact.

The component shown in FIG. 4B is made up of only two sections. In this case, the laser 30 transmits at a wavelength of 1.55 µm which is longer than the receive wavelength 1.3 µm of the detector 20. The detector 20 therefore remains transparent at the wavelength 1.55 µm, and it correctly receives the signal that is sent to it at 1.3 µm, so that it is not necessary to place a light-absorbing section between the laser and the detector.

Also in this case, the resistive zone I situated at the interface between the two sections is implemented in a manner such that it does not extend through the waveguides 21, 31.

The examples that are described below relate to the in-line transmitter-receiver component shown in FIG. 4A. However, the invention is not limited to this type of component. It also applies to any multi-section electro-optical component including waveguide ridges buried in a cladding layer. For example, it is also applicable to multi-section lasers used to perform wavelength tuning, etc.

The structure of such a multi-section component of the invention will be better understood with reference to FIGS. 5A, 5B, and 5C which show the FIG. 4 component respectively in plan, and in cross-section.

The width $l_I$ of the resistive zone I is defined along the width l of the component, and the length $L_I$ of the resistive zone I is defined along the length L of the component.

The plan view of FIG. 5A shows that the waveguides 21 and 31 of the various sections, namely the detector 20, the laser 30, and the optical isolator 40, are etched in the form of ridges, but that they are of larger width at the interfaces between the sections. The waveguide ridges 21 and 31 locally have respective widths $l_{21}$ and $l_{31}$ not less than the width $l_I$ of the resistive zone I. By increasing the width of the waveguide ridges so that they extend over the entire width of the resistive zone I, it is possible to eliminate locally the conductive channels that are created on either side of the ridges and that are due to the high doping of the cladding layer 11.

In addition, the waveguides are made locally wider at the interface between two sections over an overall length $L_2$, $L_3$ preferably not less than the length $L_I$ of the resistive zone I. The overall length is defined as being the sum of the lengths of the wide portions of the various waveguides. Thus, for example, at the interface between the optical isolator section 40 and the detector section 20, the overall length $L_2$ of the wide zone corresponds to the length of the wide portion of the waveguide 31 added to the length of the wide portion of the other waveguide 21.

The view in cross-section on A—A of FIG. 5B shows the waveguide 31 at the interface between the laser section 30 and the optical isolator section 40.

At this interface, the waveguide ridge 31 has an extended width $l_{31}$ equal to the width $l_I$ of the resistive zone I. By extending the width of the waveguide 31 in this way, it is possible to eliminate locally the conductive channels 12 situated on either side of the waveguide and as shown in FIG. 5C which is a cross-section view on B—B of the optical isolator section 40. The width of each of the conductive channels 12 is defined by a resistive zone 15 obtained previously by proton implantation or by etching so as to isolate the waveguide 31 laterally.

In order to obtain good electrical isolation at the interface between the sections 30 and 40, the width of the resistive zone $l_I$ is thus preferably not less than the conductive width of the cladding layer 11, i.e. not less than the sum of the widths of the waveguide 31 ($l_{31}$) and of the conductive channels 12. The width $l_I$ of the resistive zone is thus defined by the lateral isolation zones 15.

The electrical isolation zone I is also formed over a depth p that is shallow enough not to extend through or even to reach the waveguide 31. Thus, the resistive zone I has a bottom situated a certain distance h above the top surface of the waveguide 31.

In a variant embodiment, and as shown diagrammatically in FIGS. 6A and 6B, it is possible for the waveguide to be locally non-etched below the isolation zone I so that it has a width $l_{31}$, $l_{21}$ equal to the width l of the optical component.

The electrical isolation zone I may be obtained independently by proton implantation or by etching the material of the cladding. Since the implantation or the etching does not extend through the waveguides, the optical losses at the interfaces between the sections of the in-line transmitter-receiver of the invention are reduced considerably.

FIG. 3 shows three comparative curves of the value of the interface resistance R as a function of the distance h between the bottom of the resistive zone I and the top surface of the waveguide. Curves a and b are described above and they correspond to two prior art multi-section components.

Level 0 of the distance h corresponds to the top surface of the waveguide.

Curve c shows the interface resistance values R obtained with a component of the invention, shown in section in FIG. 3c, and in which the waveguide ridges are buried in a cladding layer. The resistance values are close to those of the ridge-type prior art component. Interface resistance values R are obtained that are not less than 15 k$\Omega$ for distances h between the bottom of the resistance zone I and the top surface of the waveguide ridge that are not less than 0.08 $\mu$m.

These results are very satisfactory since they correspond to the desired resistance values. In addition, the waveguide is not reached, and it is therefore not degraded. Optical losses, situated at the interfaces between the sections and due to implantation or etching in the core of the waveguide are therefore avoided.

The difference between the curves b and c, corresponding respectively to the ridge-type prior art component and to the component of the invention, is simply due to the fact that in the ridge-type component, the resistive zone has a width $l_I$ of about 3 $\mu$m, whereas, the width $l_I$ of the isolation zone I of the component of the invention is slightly greater, e.g. about 10 $\mu$m.

The invention is applicable not only to the above-described in-line transmitter-receiver. More generally, it is applicable to any multi-section monolithic electro-optical component having a buried active ridge. It is also independent of the composition and of the dimensions of the waveguides, and of the doping type (n or p) of the substrate and of the cladding layer.

What is claimed is:

1. A semiconductor electro-optical monolithic component made up of at least two sections, each of which has a respective waveguide, said waveguides being etched in the form of ridges, disposed in line, and buried in a cladding layer, and said sections being electrically isolated from one other by a resistive zone, wherein, at the interface between two sections, the waveguides are locally of an extended width not less than the width of the resistive zone.

2. A component according to claim 1, wherein the waveguides are locally wider at the interface between two sections, over an overall length not less than the length of the resistive zone.

3. A component according to claim 1, wherein the resistive zone has a width not less than the conductive width of the cladding layer.

4. A component according to claim 1, wherein the resistive zone is obtained by locally implanting protons in the cladding layer, and it has a bottom situated at a distance not less than 0.08 $\mu$m above the top surfaces of the waveguides.

5. A component according to claim 1, wherein the resistive zone is obtained by locally etching the cladding layer, and it has a bottom situated at a distance not less than 0.08 $\mu$m above the top surfaces of the waveguides.

6. A component according to claim 1, constituting an in-line transmitter-receiver.

* * * * *